United States Patent
Killen et al.

(10) Patent No.: US 6,727,785 B2
(45) Date of Patent: *Apr. 27, 2004

(54) HIGH EFFICIENCY SINGLE PORT RESONANT LINE

(75) Inventors: William D. Killen, Melbourne, FL (US); Randy T. Pike, Grant, FL (US)

(73) Assignee: Harris Corporation, Melbourne, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 10/185,144

(22) Filed: Jun. 27, 2002

(65) Prior Publication Data

US 2004/0000975 A1 Jan. 1, 2004

(51) Int. Cl.[7] ................................................. H01P 7/00
(52) U.S. Cl. ................................... 333/219; 333/205
(58) Field of Search ..................... 333/204, 205, 333/219

(56) References Cited

U.S. PATENT DOCUMENTS

| 3,571,722 A | 3/1971 | Vendelin |
| 3,678,418 A | 7/1972 | Woodward |
| 4,495,505 A | 1/1985 | Shields |
| 4,525,720 A | 6/1985 | Corzine et al. |

(List continued on next page.)

FOREIGN PATENT DOCUMENTS

| JP | 03173201 | 7/1991 |
| JP | 05211402 | 8/1993 |
| JP | 07111407 | 4/1995 |
| WO | WO 0101453 | 1/2001 |

OTHER PUBLICATIONS

Smith et al., "Composite Medium with Simultaneously Negative Permeability and Permittivity", Physcial Review Letters, vol. 84 No. 18, May 1, 2000, pp. 4184–4187.*

(List continued on next page.)

*Primary Examiner*—Robert Pascal
*Assistant Examiner*—Kimberly E Glenn
(74) *Attorney, Agent, or Firm*—Sacco & Associates, P.A

(57) ABSTRACT

A printed circuit for processing radio frequency signals. The printed circuit includes a substrate. The substrate can be a meta material and can include at least one dielectric layer. The dielectric layer can have a first set of dielectric properties over a first region and a second set of dielectric properties over a second region. The dielectric permittivity and/or magnetic permeability of the second set of dielectric properties can be different than the first set of dielectric properties. The printed circuit also can include a single port resonant line and a ground coupled to the substrate. The dielectric properties can be controlled to adjust the size of the resonant line. The dielectric properties also can be controlled to adjust an impedance, quality factor and/or capacitance on the resonant line. Resonant characteristics of the resonant line can be distributed through the substrate.

16 Claims, 3 Drawing Sheets

U.S. PATENT DOCUMENTS

| | | | |
|---|---|---|---|
| 4,800,344 A | | 1/1989 | Graham |
| 4,825,220 A | | 4/1989 | Edward et al. |
| 4,882,553 A | | 11/1989 | Davies et al. |
| 4,916,410 A | | 4/1990 | Littlefield |
| 4,924,236 A | | 5/1990 | Schuss et al. |
| 5,039,891 A | | 8/1991 | Wen et al. |
| 5,148,130 A | | 9/1992 | Dietrich |
| 5,162,761 A | * | 11/1992 | Kita et al. ............ 333/219 |
| 5,248,949 A | * | 9/1993 | Eguchi et al. ............ 333/204 |
| 5,293,140 A | * | 3/1994 | Higgins ............ 333/204 |
| 5,343,176 A | * | 8/1994 | Hasler ............ 333/204 |
| 5,379,006 A | | 1/1995 | McCorkle |
| 5,455,545 A | | 10/1995 | Garcia |
| 5,523,728 A | | 6/1996 | McCorkle |
| 5,569,488 A | | 10/1996 | Frankosky |
| 5,678,219 A | | 10/1997 | Agarwal et al. |
| 6,052,039 A | | 4/2000 | Chiou et al. |
| 6,114,940 A | | 9/2000 | Kakinuma et al. |
| 6,133,806 A | | 10/2000 | Sheen |
| 6,137,376 A | | 10/2000 | Imbornone et al. |
| 6,184,845 B1 | | 2/2001 | Leisten et al. |
| 6,307,509 B1 | * | 10/2001 | Krantz ............ 343/700 MS |
| 6,535,085 B2 | * | 3/2003 | Song et al. ............ 333/219 |
| 6,556,109 B2 | * | 4/2003 | Kanba et al. ............ 333/204 |
| 2003/0034922 A1 | * | 2/2003 | Isaacs et al. ............ 343/702 |

OTHER PUBLICATIONS

Shelby et al., "Microwave transmission through a two–dimensional, isotropic, left–handed metamaterial", Applied Physics Letter vol. 78, No. 4, Jan. 22, 2001, pp. 489–491.*

U.S. patent application Ser. No. 10/448,973, Delgado et al., filed May 30, 2003.

U.S. patent application Ser. No. 10/184,277, Killen et al., filed Jun. 27, 2002.

U.S. patent application Ser. No. 10/185,443, Killen et al., filed Jun. 27, 2002.

U.S. patent application Ser. No. 10/184,332, Killen et al., filed Jun. 27, 2002.

U.S. patent application Ser. No. 10/185,251, Parsche et al., filed Jun. 27, 2002.

U.S. patent application Ser. No. 10/185,847, Killen et al., filed Jun. 27, 2002.

U.S. patent application Ser. No. 10/185,275, Killen et al., filed Jun. 27, 2002.

U.S. patent application Ser. No. 10/185,273, Killen et al., filed Jun. 27, 2002.

U.S. patent application Ser. No. 10/308,500, Killen et al., filed Dec. 3, 2002.

U.S. patent application Ser. No. 10/373,935, Killen et al., filed Feb. 25, 2003.

U.S. patent application Ser. No. 10/404,285, Killen et al., filed Mar. 31, 2003.

U.S. patent application Ser. No. 10/404,981, Killen et al., filed Mar. 31, 2003.

U.S. patent application Ser. No. 10/404,960, Killen et al., filed Mar. 31, 2003.

U.S. patent application Ser. No. 10/185,266, Killen et al., filed Jun. 27, 2002.

U.S. patent application Ser. No. 10/185,162, Rumpf, Jr. et al., filed Jun. 27, 2002.

U.S. patent application Ser. No. 10/185,824, Killen et al., filed Jun. 27, 2002.

U.S. patent application Ser. No. 10/185,187, Killen et al., filed Jun. 27, 2002.

U.S. patent application Ser. No. 10/185,855, Killen et al., filed Jun. 27, 2002.

U.S. patent application Ser. No. 10/185,459, Killen et al., filed Jun. 27, 2002.

U.S. patent application Ser. No. 10/185,480, Killen et al., filed Jun. 27, 2002.

U.S. patent application Ser. No. 10/439,094, Delgado et al., filed May 15, 2003.

* cited by examiner

Sect. B-B

HIGH EFFICIENCY SINGLE PORT RESONANT LINE

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved performance in single port resonant lines.

2. Description of the Related Art

RF circuits, transmission lines and antenna elements are commonly manufactured on specially designed substrate boards. For the purposes of these types of circuits, it is important to maintain careful control over impedance characteristics. If the impedance of different parts of the circuit do not match, this can result in inefficient power transfer, unnecessary heating of components, and other problems. Electrical length of transmission lines and radiators in these circuits can also be a critical design factor.

Two critical factors affecting the performance of a substrate material are permittivity (sometimes called the relative permittivity or $\epsilon_r$) and the loss tangent (sometimes referred to as the dissipation factor). The relative permittivity determines the speed of the signal, and therefore the electrical length of transmission lines and other components implemented on the substrate. The loss tangent determines the amount of loss that occurs for signals traversing the substrate material. Losses tend to increase with increases in frequency. Accordingly, low loss materials become even more important with increasing frequency, particularly when designing receiver front ends and low noise amplifier circuits.

Printed transmission lines, passive circuits and radiating elements used in RF circuits are typically formed in one of three ways. One configuration known as microstrip, places the signal line on a board surface and provides a second conductive layer, commonly referred to as a ground plane. A second type of configuration known as buried microstrip is similar except that the signal line is covered with a dielectric substrate material. In a third configuration known as stripline, the signal line is sandwiched between two electrically conductive (ground) planes. In general, the characteristic impedance of a parallel plate transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the physical geometry and spacing of the line structure as well as the permittivity of the dielectric material(s) used to separate the transmission line structures. Conventional substrate materials typically have a relative permeability of 1.

In conventional RF design, a substrate material is selected that has a relative permittivity value suitable for the design. Once the substrate material is selected, the line characteristic impedance value is exclusively adjusted by controlling the line geometry and physical structure.

Radio frequency (RF) circuits are typically embodied in hybrid circuits in which a plurality of active and passive circuit components are mounted and connected together on a surface of an electrically insulating board substrate such as a ceramic substrate. The various components are generally interconnected by printed metallic conductors of copper, gold, or tantalum, for example that are transmission lines as stripline or microstrip or twin-line structures.

The permittivity of the chosen substrate material for a transmission line, passive RF device, or radiating element influences the physical wavelength of RF energy at a given frequency for that line structure. One problem encountered when designing microelectronic RF circuitry is the selection of a dielectric board substrate material that is optimized for all of the various passive components, radiating elements and transmission line circuits to be formed on the board. In particular, the geometry of certain circuit elements may be physically large or miniaturized due to the unique electrical or impedance characteristics required for such elements. For example, many circuit elements or tuned circuits may need to be an electrical ¼ wave. Similarly, the line widths required for exceptionally high or low characteristic impedance values can, in many instances, be too narrow or too wide respectively for practical implementation for a given substrate. Since the physical size of the microstrip or stripline is inversely related to the relative permittivity of the dielectric material, the dimensions of a transmission line can be affected greatly by the choice of substrate board material.

Still, an optimal board substrate material design choice for some components may be inconsistent with the optimal board substrate material for other components, such as antenna elements. Moreover, some design objectives for a circuit component may be inconsistent with one another. For example, it may be desirable to reduce the size of an antenna element. This could be accomplished by selecting a board material with a relatively high dielectric. However, the use of a dielectric with a higher relative permittivity will generally have the undesired effect of reducing the radiation efficiency of the antenna. Accordingly, the constraints of a circuit board substrate having selected relative dielectric properties often results in design compromises that can negatively affect the electrical performance and/or physical characteristics of the overall circuit.

An inherent problem with the foregoing approach is that, at least with respect to the substrate, the only control variable for line impedance is the relative permittivity, $\epsilon_r$. This limitation highlights an important problem with conventional substrate materials, i.e. they fail to take advantage of the other factor that determines characteristic impedance, namely $L_l$, the inductance per unit length of the transmission line.

Yet another problem that is encountered in RF circuit design is the optimization of circuit components for operation on different RF frequency bands. Line impedances and lengths that are optimized for a first RF frequency band may provide inferior performance when used for other bands, either due to impedance variations and/or variations in electrical length. Such limitations can limit the effective operational frequency range for a given RF system.

Conventional circuit board substrates are generally formed by processes such as casting or spray coating which generally result in uniform substrate physical properties, including the permittivity. Accordingly, conventional dielectric substrate arrangements for RF circuits have proven to be a limitation in designing circuits that are optimal in regards to both electrical and physical size characteristics.

SUMMARY OF THE INVENTION

The present invention relates to a printed circuit for processing radio frequency signals. The printed circuit includes a substrate where a single port resonant line can be placed. The substrate can be a meta material and can include at least one dielectric layer. The dielectric layer can have a first set of dielectric properties over a first region, and at least a second set of dielectric properties over a second region. The second set of dielectric properties can provide a different dielectric permittivity and/or magnetic permeability as compared to the first set of dielectric properties. The second region can be divided into sub-regions with varying dielectric properties.

The second set of dielectric properties can be controlled to reduce a size of the single port resonant line and/or to distribute at least one resonant characteristic of the single port resonant line through the substrate. The dielectric properties also can be controlled to reduce a propagation velocity of a signal on the single port resonant line or adjust an impedance measured on said single port resonant line. Further, the second set of dielectric properties can be controlled to adjust an inductance, capacitance, or quality factor (Q) associated with the single port resonant line.

The printed circuit can include at least one ground coupled to the substrate. The single port resonant line can be coupled to the second region, and either shorted to ground or electrically open with respect to the ground. The single port resonant line can be connected to a first port and a second port via a transmission line. A transition zone can be located at a transition between the transmission line and the first and second ports. The transition zone can have a higher permeability than the first region to minimize signal reflections on the first and second ports and on the transmission line.

DETAILED DESCRIPTION OF THE PREFERRED EMBODIMENTS

A resonant line is a transmission line typically used in radio frequency (RF) circuits. On printed circuit boards or substrates, single port resonant lines are typically implemented by creating a line with a single port at the input and either open-circuited or short-circuited to ground at the termination. The electrical length of a single port resonant line is usually some multiple of a quarter-wavelength of a selected frequency. The input impedance to a single port resonant line is typically resistive when the length of the resonant line is an even or odd multiple of the quarter-wavelength of the operational frequency. That is, the input to the single port resonant line is at a position of voltage maxima or minima. When the input to the single port resonant line is at a position between the voltage maxima and minima points, the input impedance can have reactive components, which can be a useful feature.

Low permittivity printed circuit board materials are ordinarily selected for RF circuit designs. For example, polytetrafluoroethylene (PTFE) based composites such as RT/duroid® 6002 (permittivity of 2.94; loss tangent of 0.009) and RT/duroid® 5880 (permittivity of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide dielectric layers having relatively low permittivitys with accompanying low loss tangents.

However, use of conventional board materials can compromise the miniaturization of circuit elements and may also compromise some performance aspects of circuits that can benefit from high permittivity layers. A typical tradeoff in a communications circuit is between the physical size of a resonant line versus operational frequency. By comparison, the present invention provides the circuit designer with an added level of flexibility by permitting use of a high permittivity dielectric layer region with magnetic properties optimized for reducing the length and width of a resonant line for operation at a specific frequency. Further, the present invention also provides the circuit designer with means for controlling the quality factor (Q) of the resonant line. This added flexibility enables improved performance and resonant line density and performance not otherwise possible for radio frequency (RF) circuits. As defined herein, radio frequency means any frequency that can be used to propagate an electromagnetic wave.

Figure 1:
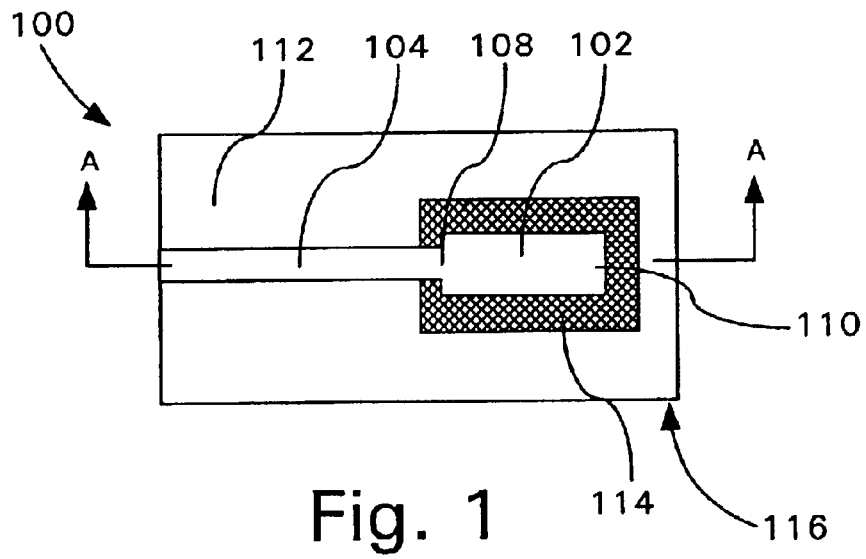
FIG. 1 is a top view of a single port resonant line formed on a substrate for reducing the size of the resonant line in accordance with the present invention.

Referring to FIG. 1, according to the preferred embodiment a dielectric layer 100 comprises a first region 112 having a first set of dielectric properties and a second region 114 having a second set of dielectric properties. The dielectric properties can include a permittivity and a permeability. Notably, the second set of dielectric properties can be different than the first set of dielectric properties. For example, the second region 114 can have a higher permittivity and/or permeability than that of the first region 112.

Resonant line 102 can be attached to the dielectric layer 100. The resonant line 102 can be configured to have an input port 108 connecting to a transmission line 104. In one embodiment the length of the resonant line 102 can be one-quarter of the wavelength of a signal applied to the resonant line by the transmission line 104. Further, the resonant line 102 can be wider than the transmission line 104. It will be appreciated by those skilled in the art, however, that the invention is not so limited and the resonant line also can be configured in differing shapes. For example, in one arrangement the resonant line can have an expanding or tapered width, or can have a circular stub. Still, other resonant line shapes can be utilized.

Resonant line 102 and the second region 114 of the dielectric layer can be configured so that at least a portion of the resonant line 102 is positioned on the second region 114 as shown. In a preferred embodiment, at least a substantial region of the resonant line 102 can be positioned on the second region 114.

The propagation velocity of a signal traveling on the resonant line is equal to $$\frac{c}{\sqrt{\mu_r \varepsilon_r}}.$$

Accordingly, increasing the permeability and/or permittivity in the second region 114 decreases propagation velocity of the signal on the resonant line 102, and thus the signal wavelength. Hence, the one-quarter wavelength (or any multiple thereof) of the resonant line 102 can be reduced by increasing the permeability and/or permittivity. Accordingly, the area of the dielectric layer 100 incorporating the resonant line to be smaller than the area that would be required on a conventional circuit board.

The second region 114 also can have a permittivity selected to achieve a particular capacitance for the resonant line 102. Further, the permeability can be selected to result in a particular inductance for resonant line 102 as well. The permittivity and permeability can be chosen to result in a desired $Z_0$ for the resonant line 102. $Z_0$ can be selected to achieve a desired Q for particular resonances on the resonant line 102, shape the resonant response of the resonant line 102, and/or adjust voltage maxima and minima. Further, $Z_0$ can be selected to suppress higher resonant modes and/or to create a mismatch between the impedance of the resonant line 102 and the impedance of free space. This impedance mismatch can help to minimize RF radiation from the resonant line 102 and reduce electromagnetic interference (EMI).

The resonant characteristics of the resonant line 102 can be distributed through the first and second regions 112 and 114 as the electric fields and magnetic fields formed in these regions store and release energy. The amount of energy stored and released by the fields can be adjusted by controlling permittivities and permeabilities associated with different regions in the dielectric layer. For example, a higher permittivity in a particular region will result in greater energy stored in the electric fields formed in that region. Likewise, higher permeability in a particular region will result in greater energy stored in the magnetic fields formed in that region.

Figure 2:
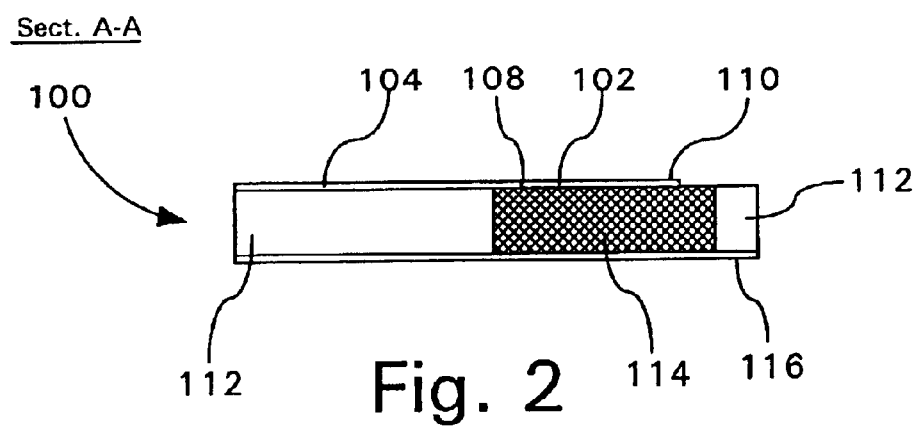
FIG. 2 is a cross-sectional view of an open-circuit configuration of the single port resonant line of FIG. 1 taken along line A—A.
Figure 3:
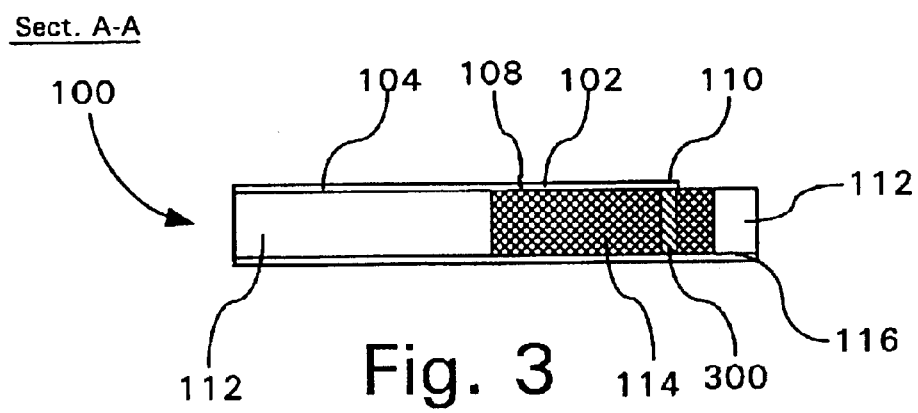
FIG. 3 is a cross-sectional view of a short circuit configuration of the single port resonant line of FIG. 1 taken along line A—A.

FIGS. 2 and 3 are sectional views, shown along section line A—A, of two different embodiments of the resonant line 102 and dielectric layer 100 of FIG. 1. A ground plane 116 is provided beneath the resonant line 102 in both embodiments shown. The resonant line shown in FIG. 2 is an open-circuited resonant line. The resonant line of FIG. 3 is a short-circuited with a shorting feed 300 provided to short the distal end 110 of the resonant line 102 to the ground plane 116. A circuit designer can select either an open-circuited or short-circuited resonant line, depending on the application, to provide the voltage and/or impedance characteristics desired from the resonant line.

Dielectric layer 100 has a thickness that defines a resonant line height above ground. The thickness is approximately equal to the physical distance from the resonant line 102 to the underlying ground plane 116. This distance can be adjusted to achieve particular dielectric geometries, for example, to increase or decrease capacitance when a certain dielectric material is used.

Figure 4:
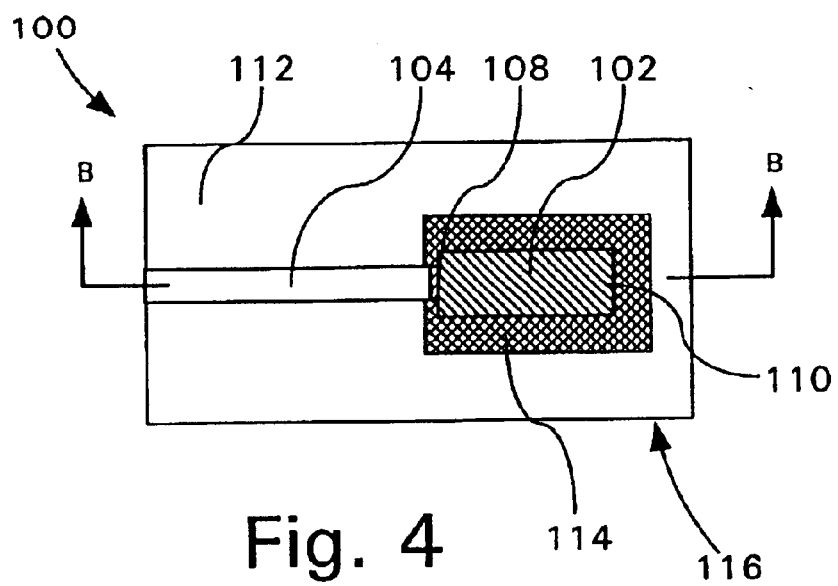
FIG. 4 is a top view of an alternate embodiment of a single port resonant line formed on a substrate for reducing the size of the resonant line in accordance with the present invention.
Figure 5:
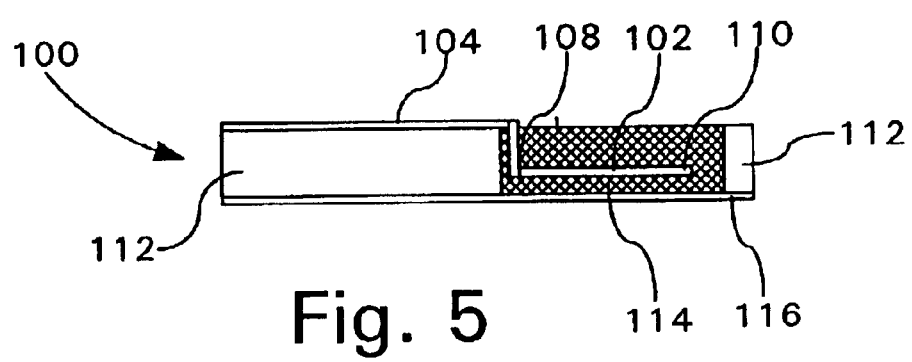
FIG. 5 is a cross-sectional view of an open-circuit configuration of the single port resonant line of FIG. 4 taken along line B—B.
Figure 6:
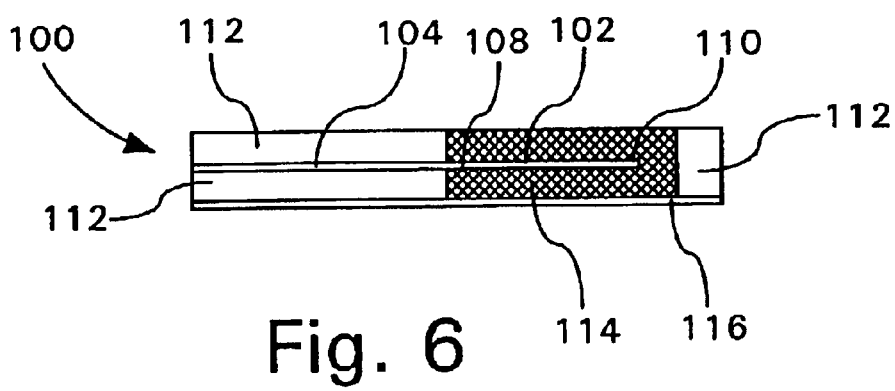
FIG. 6 is a cross-sectional view of another alternate embodiment of single port resonant line in accordance with the present invention.

Referring to FIGS. 4 and 5, another arrangement for the resonant line 102 is shown wherein the resonant line 102 is located within the second region 114 and positioned closer to the ground plane 116. This configuration can further increase the capacitance between the resonant line 102 and the ground plane 116 while maintaining a relatively low capacitance between transmission line 104 and the ground plane 116. Alternatively, a buried microstrip arrangement, as shown in FIG. 6, can be used if higher capacitance between the transmission line 104 and the ground plane 116 is desired. A stripline arrangement can result in an even higher capacitance value for both the transmission line 104 and resonant line 102. A shorting feed (not shown) can be provided in any of these configurations as well.

In one embodiment of the invention the permeability of the dielectric layer 100 can be controlled to increase the inductance of the resonant line 102. In another embodiment (not shown), the resonant line can have its own individual ground plane 116 or return trace (such as in a twin line arrangement) configured so that current on the ground plane 116 or return trace flows in an opposite direction to current flowing in the resonant line 102, thereby resulting in cancellation of magnetic flux associated with the resonant line and lowering its inductance.

In one alternate embodiment the second region 114 can comprise a third sub-region and a fourth sub region. The third and fourth sub-regions can have differing dielectric properties. For example, the permittivity and/or permeability in the third sub-region can be higher or lower than the permittivity and/or permeability in the fourth sub region. The respective permittivities and/or permeabilities can be used to control the impedance and resonant characteristics of the resonant line 102.

It should be noted that the resonant line 102 and circuit layer 100 configurations are not limited to the exemplary figures shown. For example, the resonant line can have varying shapes and can be positioned to have varying distances between the resonant line and the ground plane or circuit layer surface. In one embodiment, $Z_0$ can be controlled over the entire length of resonant line 102, or any part thereof, using multiple dielectric and ferromagnetic mixtures or concentrations to vary $Z_0$ over different regions of the line. Further, the dielectric and magnetic properties can be differentially modified at selected regions of the dielectric layer to optimize resonant line performance. In yet another arrangement, all dielectric layer regions can be modified by differentially modifying dielectric properties and magnetic properties in all regions of the dielectric layer.

The term "differential modifying" as used herein refers to any modifications, including additions, to the dielectric layer 100 that result in at least one of the dielectric and magnetic properties being different at one region of the substrate as compared to another region. For example, the modification can be selective modification where certain dielectric layer regions are modified to produce a first set of dielectric or magnetic properties, while other dielectric layer regions are left un-modified having dielectric and magnetic properties different from the first set of properties resulting from the modification.

Figure 7:
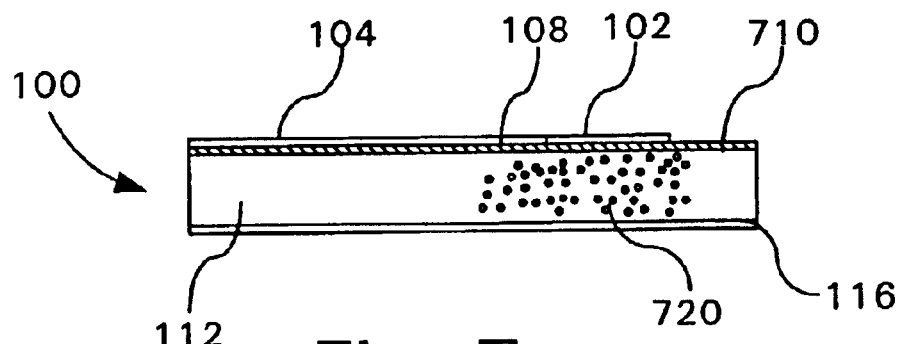
FIG. 7 is a cross-sectional view of another embodiment of a single port resonant line formed on a substrate for reducing the size of the resonant line in accordance with the present invention.

According to one embodiment, a supplemental dielectric layer can be added to dielectric layer 100. Techniques known in the art such as various spray technologies, spin-on technologies, various deposition technologies or sputtering can be used to apply the supplemental layer. Referring to FIG. 7, a first supplemental layer 710 can be added over the entire existing dielectric layer 100 and/or a second supplemental layer 720 can be selectively added in the first region 112 and/or the second region 114. The supplemental layers can change the permittivity and/or permeability of the dielectric beneath resonant line 102.

Notably, the second supplemental layer 720 can include particles to change the permeability in the first region 112 or second region 114 to be greater or less than 1. For example, diamagnetic or ferromagnetic particles can be added to the first and second regions 112 and 114. Further, the second supplemental layer 720 can include dielectric particles to change the dielectric properties as well. For example, dielectric particles can be added to the first and second regions 112 and 114.

Figure 8:
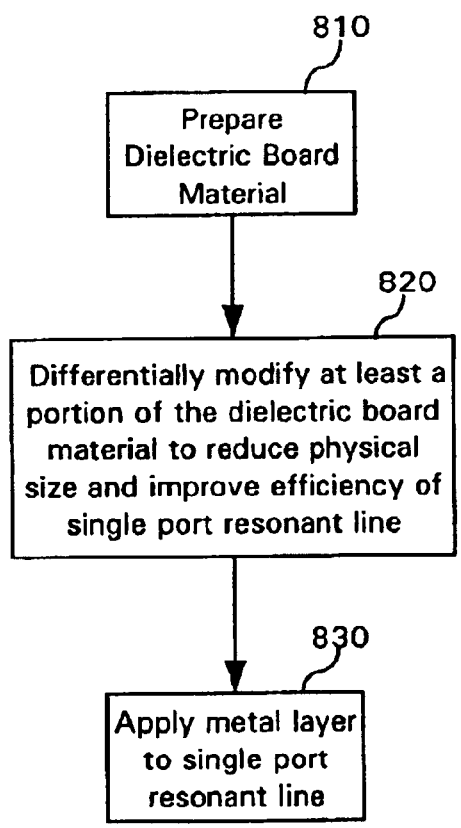
FIG. 8 is a flow chart that is useful for illustrating a process for manufacturing a resonant line of reduced physical size in accordance with the present invention.

A method for providing a size and performance optimized resonant line is described with reference to the text below and the flow chart presented in FIG. 8. In step 810, board dielectric material is prepared for modification. As previously noted, the board material can include commercially available off the shelf board material or customized board material formed from a polymer material, or some combination thereof. The preparation process can be made dependent upon the type of board material selected.

In step 820, one or more dielectric layer regions such as the first region 112 or second region 114 is differentially modified so that the permittivity or magnetic properties in the second region 106 is different as compared to permittivity or permeability of the second region 104. The differential modification can be accomplished in several different ways, as previously described. Referring to step 830, the metal layer then can be applied to the single port resonant line using standard circuit board techniques known in the art.

Dielectric substrate boards having metamaterial regions providing localized and selectable magnetic and dielectric properties can be prepared in the following manner. As defined herein, the term "metamaterials" refers to composite materials formed from the mixing or arrangement of two or more different materials at a very fine level, such as the molecular or nanometer level. Metamaterials allow tailoring of electromagnetic properties of the composite, which can be defined by effective electromagnetic parameters comprising effective electrical permittivity $\epsilon_{eff}$ (or permittivity) and the effective magnetic permeability $\mu_{eff}$.

Appropriate bulk dielectric substrate materials can be obtained from commercial materials manufacturers, such as DuPont and Ferro. The unprocessed material, commonly called Green Tape™, can be cut into sized regions from a bulk dielectric tape, such as into 6 inch by 6 inch regions. For example, DuPont Microcircuit Materials provides Green Tape material systems, such as 951 Low-Temperature Cofire Dielectric Tape and Ferro Electronic Materials ULF28-30 Ultra Low Fire COG dielectric formulation. These substrate materials can be used to provide dielectric layers having relatively moderate permittivities with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying regions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include metamaterials. The choice of a metamaterial composition can provide tunable effective dielectric constants over a relatively continuous range from less than 2 to about 2650. Tunable magnetic properties are also available from certain metamaterials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a dielectric substrate layer that result in at least one of the dielectric and magnetic properties being different at one region of the substrate as compared to another region. A differentially modified board substrate preferably includes one or more metamaterial containing regions.

For example, the modification can be selective modification where certain dielectric layer regions are modified to produce a first set of dielectric or magnetic properties, while other dielectric layer regions are modified differentially or left unmodified to provide dielectric and/or magnetic properties different from the first set of properties. Differential modification can be accomplished in a variety of different ways.

According to one embodiment, a supplemental dielectric layer can be added to the dielectric layer. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing dielectric layer. For example, a supplemental dielectric layer can be used for providing a substrate region having an increased effective dielectric constant. The dielectric material added as a supplemental layer can include various polymeric materials.

The differential modifying step can further include locally adding additional material to the dielectric layer or supplemental dielectric layer. The addition of material can be used to further control the effective dielectric constant or magnetic properties of the dielectric layer to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanosize particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic metamaterial particles that are generally suitable for controlling magnetic properties of dielectric layer for a variety of applications described herein include ferrite organoceramics (FexCyHz)—(Ca/Sr/Ba-Ceramic). These particles work well for applications in the frequency range of 8–40 GHz. Alternatively, or in addition thereto, niobium organoceramics (NbCyHz)—(Ca/Sr/Ba-Ceramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer matrix or side chain moiety. In addition to controlling the magnetic properties of the dielectric, the added particles can also be used to control the effective dielectric constant of the material. Using a fill ratio of composite particles from approximately 1 to 70%, it is possible to raise and possibly lower the dielectric constant of substrate dielectric layer and/or supplemental dielectric layer regions significantly. For example, adding organofunctionalized nanoparticles to a dielectric layer can be used to raise the dielectric constant of the modified dielectric layer regions.

Particles can be applied by a variety of techniques including polyblending, mixing and filling with agitation. For example, a dielectric constant may be raised from a value of 2 to as high as 10 by using a variety of particles with a fill ratio of up to about 70%. Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable dielectric properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low dielectric constant (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. %, to render these or any other material significantly magnetic. For example, magnetic properties may be tailored with organofunctionality. The impact on dielectric constant from adding magnetic materials generally results in an increase in the dielectric constant.

Medium dielectric constant materials have a dielectric constant generally in the range of 70 to 500 +/– 10%. As noted above these materials may be mixed with other materials or voids to provide desired effective dielectric constant values. These materials can include ferrite doped calcium titanate. Doping metals can include magnesium, strontium and niobium. These materials have a range of 45 to 600 in relative magnetic permeability.

For high dielectric constant applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organo functional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including metamaterials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate region.

A top layer conductor print is then generally applied to the modified substrate layer, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then is further processed as described above or placed into an oven to be fired to a temperature suitable for the processed substrate (approximately 850 C to 900 C for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, dielectric substrate materials can be provided with localized tunable dielectric and/or magnetic characteristics for improving the density and performance of circuits, including those comprising single port resonant lines. The dielectric flexibility allows independent optimization of circuit elements.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A printed circuit for processing radio frequency signals, comprising:
    a substrate where said circuit can be placed, said substrate comprising a metamaterial and including at least one dielectric layer, said dielectric layer having a first set of dielectric properties over a first region, and at least a second set of dielectric properties over a second region, said second set of dielectric properties being different than said first set of dielectric properties;

at least one ground coupled to said substrate; and, a single port resonant line, said single port resonant line coupled to said second region.

2. The circuit of claim 1 wherein said second set of dielectric properties is controlled to reduce a size of said single port resonant line.

3. The circuit of claim 1 wherein at least one resonant characteristic of said single port resonant line is distributed through said substrate.

4. The circuit of claim 1 wherein said second set of dielectric properties comprises at least one of a second permittivity and a second permeability.

5. The circuit of claim 4 wherein said second permeability is higher than a first permeability associated with said first set of dielectric properties.

6. The circuit of claim 4 wherein said second permittivity is higher than a first permittivity associated with said first set of dielectric properties.

7. The circuit of claim 1 wherein an end of said single port resonant line is electrically connected to said ground.

8. The circuit of claim 1 wherein said single port resonant line is electrically open with respect to ground.

9. The circuit of claim 1 wherein said second region comprises a plurality of sub-regions.

10. The circuit of claim 9 wherein at least one of a permeability and a permittivity varies among said plurality of sub-regions.

11. The circuit of claim 1 wherein said second set of dielectric properties is controlled to reduce a propagation velocity of a signal on said single port resonant line.

12. The circuit of claim 1 wherein said second set of dielectric properties is controlled to adjust a resonance on said single port resonant line.

13. The circuit of claim 1 wherein said second set of dielectric properties is controlled to adjust an amplitude of at least one of a voltage maxima and a voltage minima measured on said single port resonant line.

14. The circuit of claim 1 wherein said second set of dielectric properties is controlled to adjust an impedance measured on said single port resonant line.

15. The circuit of claim 1 wherein said second set of dielectric properties is controlled to adjust a capacitance between said single port resonant line and another structure.

16. The circuit of claim 1 wherein said second set of dielectric properties and said second set of dielectric properties is controlled to adjust a quality factor (Q) of said single resonant line.

* * * * *